United States Patent
Li

(10) Patent No.: US 9,818,339 B2
(45) Date of Patent: Nov. 14, 2017

(54) SHIFT REGISTER UNIT AND METHOD OF DRIVING THE SAME, GATE SCANNING CIRCUIT

(71) Applicant: BOE TECHNOLOGY GROUP CO., LTD., Beijing (CN)

(72) Inventor: Quanhu Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 51 days.

(21) Appl. No.: 14/906,369

(22) PCT Filed: Aug. 20, 2015

(86) PCT No.: PCT/CN2015/087661
§ 371 (c)(1),
(2) Date: Jan. 20, 2016

(87) PCT Pub. No.: WO2016/123962
PCT Pub. Date: Aug. 11, 2016

(65) Prior Publication Data
US 2016/0372031 A1 Dec. 22, 2016

(30) Foreign Application Priority Data
Feb. 5, 2015 (CN) .......................... 2015 1 0061309

(51) Int. Cl.
*G11C 19/00* (2006.01)
*G09G 3/3225* (2016.01)
(Continued)

(52) U.S. Cl.
CPC ......... *G09G 3/3225* (2013.01); *G09G 3/3266* (2013.01); *G11C 19/28* (2013.01);
(Continued)

(58) Field of Classification Search
None
See application file for complete search history.

(56) References Cited

U.S. PATENT DOCUMENTS

2003/0227433 A1 12/2003 Moon
2009/0167668 A1 7/2009 Kim
(Continued)

FOREIGN PATENT DOCUMENTS

CN 101752005 A 6/2010
CN 102682689 A 9/2012
(Continued)

OTHER PUBLICATIONS

1st office action issued in corresponding Chinese application No. 201510061309.6 dated Jul. 6, 2016.
(Continued)

*Primary Examiner* — Tuan T Lam
(74) *Attorney, Agent, or Firm* — Nath, Goldberg & Meyer; Joshua B. Goldberg; Annie J. Kock

(57) ABSTRACT

A shift register unit, a method for driving the same and a gate scanning circuit are provided. The shift register unit comprises an input module for receiving a signal to be shifted, an output module, a reset module and a reset control module, an output terminal of the input module, a control terminal of the output module and an output terminal of the reset module are connected to a first node, an output terminal of the reset control module is connected with a control terminal of the reset module for turning on the reset module under control of control signal received by control terminal of the reset control module to reset the first node, the output module outputs a shifted signal with multiple pulses before the first node is reset. According to the present invention, a gate driving signal with multiple pulses can be outputted by one shift register unit.

31 Claims, 3 Drawing Sheets

(51) Int. Cl.
*G09G 3/3266* (2016.01)
*G11C 19/28* (2006.01)
*G09G 3/36* (2006.01)

(52) U.S. Cl.
CPC ... *G09G 3/3677* (2013.01); *G09G 2300/0426* (2013.01); *G09G 2310/0286* (2013.01); *G09G 2310/061* (2013.01); *G09G 2310/08* (2013.01)

(56) References Cited

U.S. PATENT DOCUMENTS

| | | | | |
|---|---|---|---|---|
| 2014/0064438 A1* | 3/2014 | Wu | ...................... | G09G 3/3266 377/64 |
| 2016/0307641 A1* | 10/2016 | Zheng | .................. | G09G 3/3677 |
| 2016/0358666 A1* | 12/2016 | Pang | ...................... | G11C 19/28 |
| 2016/0372070 A1* | 12/2016 | Hu | ...................... | G09G 3/3614 |
| 2017/0039930 A1* | 2/2017 | Li | ...................... | G09G 3/2092 |
| 2017/0039950 A1* | 2/2017 | Li | ...................... | G09G 3/3258 |

FOREIGN PATENT DOCUMENTS

| | | | |
|---|---|---|---|
| CN | 102682692 A | 9/2012 | |
| CN | 102831861 A | 12/2012 | |
| CN | 102881248 A | 1/2013 | |
| CN | 104269134 A | 1/2015 | |
| CN | 104575396 A | 4/2015 | |
| KR | 100798111 B1 | 1/2008 | |
| KR | 20140064045 A | 5/2014 | |

OTHER PUBLICATIONS

International Search Report dated Nov. 13, 2015 corresponding to International application No. PCT/CN2015/087661.

* cited by examiner

SHIFT REGISTER UNIT AND METHOD OF DRIVING THE SAME, GATE SCANNING CIRCUIT

This is a National Phase Application filed under 35 U.S.C. 371 as a national stage of PCT/CN2015/087661, filed Aug. 20, 2015, an application claiming the benefit of Chinese Application No. 201510061309.6, filed Feb. 5, 2015, the content of each of which is hereby incorporated by reference in its entirety.

FIELD OF THE INVENTION

The present invention relates to the field of display technology, and particularly relates to a shift register unit and a method of driving the same, a gate scanning circuit.

BACKGROUND OF THE INVENTION

As a kind of current mode light emitting devices, organic light emitting diodes (OLEDs), due to self-luminous, fast response, wide viewing angle, ability to be fabricated on a flexible substrate and other characteristics thereof, are more and more applied in the field of high performance display. According to driving mode, OLED displays can be divided into PMOLED (passive matrix driving OLED, passive matrix driving organic light emitting diode) displays and AMOLED (active matrix driving OLED, active matrix driving organic light emitting diode) displays. AMOLED displays, due to low manufacturing cost, high response speed, power saving, ability to be used in DC (direct current) driven portable equipment, wide working temperature range and other advantages thereof, are expected to be next generation of new flat panel displays to replace LCDs (liquid crystal displays), therefore, AMOLED display panels have been favored by more and more people.

However, an AMOLED display panel is generally required to be driven by a gate driving signal with multiple pulses. In addition, in order to ensure full charging, a LCD panel is also required to be driven by a gate driving signal with multiple pulses. In the prior art, a gate driving signal with multiple pulses cannot be generated by one shift register unit.

SUMMARY OF THE INVENTION

One object of the present invention is to provide a shift register unit capable of outputting a shift signal with multiple pulses, so as to output a gate driving signal with multiple pulses by one shift register unit.

The present invention provides a shift register unit comprising an input module for receiving a signal to be shifted, the shift register unit further comprises an output module, a reset module and a reset control module, wherein, an output terminal of the input module, a control terminal of the output module and an output terminal of the reset module are connected to a first node, an output terminal of the reset control module is connected with a control terminal of the reset module for turning on the reset module under the control of a control signal received by a control terminal of the reset control module to reset the first node, so that the output module outputs a shifted signal with multiple pulses before the first node is reset.

Further, the control terminal of the reset control module includes a first control terminal and a second control terminal for turning off the reset module when the first control terminal receives a first level and turning on the reset module to reset the first node when the first control terminal receives a second level and the second control terminal receives the first level.

Further, the output terminal of the input module is suitable for setting the first node to be at an output-on level capable of turning on the output module when a received signal to be shifted is at a pulse level; the output module is suitable for outputting a shifted signal when the first node is at the output-on level; the reset module is suitable for resetting the first node to be at an output-off level capable of turning off the output module after the output module outputs the shifted signal.

Further, the shift register unit comprises: a level maintaining module, which is connected with the first node and suitable for maintaining level of the first node when the input module and the reset module are turned off.

Further, the first control terminal of the reset control module is connected with an input terminal of signal to be shifted, and the second control terminal of the reset control module is connected with an output terminal of shifted signal of the shift register unit in the next stage, pulse levels of the signal to be shifted and the shifted signal are consistent with the first level, and non-pulse levels of the signal to be shifted and the shifted signal are consistent with the second level.

Further, the reset control module comprises a first receiving terminal and a second receiving terminal, wherein the second receiving terminal is used for receiving a reset-on level capable of turning on the reset module, and the first receiving terminal is used for receiving a reset-off level capable of turning off the reset module; the reset control module is suitable for connecting the first receiving terminal with the output terminal thereof when the first control terminal receives the first level, and connecting the second receiving terminal with the output terminal thereof when the second control terminal receives the first level, the output terminal outputs a level consistent with that of the first receiving terminal when the output terminal is connected with both the first receiving terminal and the second receiving terminal.

Further, the first receiving terminal of the reset control module is connected with a first common electrode, a first clock signal input terminal or the output terminal of shifted signal of the shift register unit, the first common electrode is at a level consistent with the reset-off level, the first clock signal input terminal receives a clock signal at the reset-off level when the first receiving terminal of the reset control module is connected with the output terminal of the reset control module; the second receiving terminal of the reset control module is connected with a second common electrode, the output terminal of shifted signal of the shift register unit in the next stage or a second clock signal input terminal, the second common electrode is at a level consistent with the reset-on level, the second clock signal input terminal receives a clock signal at the reset-on level when the second receiving terminal of the reset control module is connected with the output terminal of the reset control module.

Further, the reset control module comprises a first transistor and a second transistor, both the first transistor and the second transistor are turned on when control terminals thereof receives the first level and turned off when control terminals thereof receives the second level, wherein, a first terminal of the first transistor is connected with the first receiving terminal of the reset control module, a control terminal of the first transistor is connected with the first control terminal of the reset control module, a second terminal of the first transistor is connected with the output terminal of the reset control module; a first terminal of the second transistor is connected with the second receiving terminal of the reset control module, a control terminal of the second transistor is connected with the second control terminal of the reset control module, a second terminal of the second transistor is connected with the output terminal of the reset control module, the first transistor has a channel width-to-length ratio larger than that of the second transistor.

Further, the shift register unit comprises: a reset enhancing module and a reset enhancing control module, wherein, an output terminal of the reset enhancing module is connected with the first node for resetting level of the first node, an output terminal of the reset enhancing control module is connected with a control terminal of the reset enhancing module for turning on the reset enhancing module to continue to reset the first node under the control of control signal received by a control terminal of the reset enhancing control module after the level of the first node is reset to be the output-off level by the reset module.

Further, the reset enhancing control module comprises a first receiving terminal and a second receiving terminal, a first control terminal and a second control terminal, the second receiving terminal is used for receiving a reset-enhancing-on level capable of turning on the reset enhancing module, the first receiving terminal is used for receiving a reset-enhancing-off level capable of turning off the reset enhancing module; the first control terminal of the reset enhancing control module is connected with the first node for connecting the first receiving terminal and the output terminal thereof when the first node is at the output-on level, and connecting the second receiving terminal and the output terminal thereof when the second control terminal receives a respective active level, the output terminal outputs a level consistent with that of the first receiving terminal when the output terminal is connected with both the first receiving terminal and the second receiving terminal.

Further, the reset enhancing control module comprises a third control terminal and a third receiving terminal, the third receiving terminal is used for receiving the reset-enhancing-on level, the reset enhancing control module is suitable for connecting the third receiving terminal with the output terminal when the third control terminal receives a respective active level, and the output terminal outputs a level consistent with that of the first receiving terminal when the output terminal is connected with both the first receiving terminal and the third receiving terminal.

Further, the reset enhancing control module comprises a third transistor, a fourth transistor and a fifth transistor, a control terminal of the third transistor is connected with the first control terminal of the reset enhancing control module, a first terminal of the third transistor is connected with the first receiving terminal of the reset enhancing control module, a second terminal of the third transistor is connected with the output terminal of the reset enhancing control module, the first terminal of the third transistor is connected with the second terminal of the third transistor when the first control terminal of the reset enhancing control module receives the output-on level; a control terminal of the fourth transistor is connected with the second control terminal of the reset enhancing control module, a first terminal of the fourth transistor is connected with the second receiving terminal of the reset enhancing control module, a second terminal of the fourth transistor is connected with the output terminal of the reset enhancing control module; a control terminal of the fifth transistor is connected with the third control terminal of the reset enhancing control module, a first terminal of the fifth transistor is connected with the third receiving terminal of the reset enhancing control module, a second terminal of the fifth transistor is connected with the output terminal of the reset enhancing control module; the fourth transistor and the fifth transistor respectively correspond to active levels contrary to each other, or both the second receiving terminal and the third receiving terminal are used for receiving clock signals, and the second receiving terminal receives a clock signal with a phase contrary to that of clock signal received by the third receiving terminal.

Further, the shift register unit comprises: a load output module, a control terminal of the load output module is connected with the first node for outputting the shifted signal when the first node is at the output-on level.

Further, the load output module comprises a transistor, a first terminal of the transistor is connected with an input terminal of the load output module, a second terminal of the transistor is connected with an output terminal of the load output module, and a control terminal of the transistor is connected with the control terminal of the load output module.

Further, the shift register unit comprises a pinch-off module, which is turned on for pinching off the input module and/or the reset module and/or the reset enhancing module when the shifted signal outputted is at a pulse level.

Further, the shift register unit comprises: an auxiliary output module, wherein a control terminal of the auxiliary output module is connected with the first node for outputting the shifted signal when the first node is at the output-on level, the shifted signal is at a pulse level consistent with the output-on level; each of the input module, the reset module and the reset enhancing module comprises a transistor combination consisting of two transistors connected in series; a control terminal of the pinch-off module is connected with the output terminal of the load output module, an input terminal of the pinch-off module is connected with an output terminal of the auxiliary output module, an output terminal of the pinch-off module is connected with a connection node between the two transistors connected in series in the transistor combination, and when the shifted signals output by the output terminals of the load output module and the auxiliary output module are at pulse level, the input terminal and the output terminal of the pinch-off module are connected with each other, so that the connection node between the two transistors connected in series in the transistor combination is at a level consistent with the output-on level.

Further, the pinch-off module comprises a transistor, a first terminal of the transistor is connected with the input terminal of the pinch-off module, a second of the transistor is connected with the output terminal of the pinch-off module, and a control terminal of the transistor is connected with the control terminal of the pinch-off module.

Further, the auxiliary output module comprises a transistor, a first terminal of the transistor is connected with the input terminal of the auxiliary output module, a second terminal of the transistor is connected with the output terminal of the auxiliary output module, and a control terminal of the transistor is connected with the output terminal of the auxiliary output module.

Further, the shift register unit comprises three restore modules respectively for restoring output terminals of the output module, the load output module and the auxiliary output module after the output module outputs the shifted signal, so that the output terminals are restored to be the non-pulse level.

Further, control terminals of the three restore modules are connected with the output terminal of the reset enhancing control module, input terminals of the three restore modules are used for receiving the non-pulse level, output terminals of the three restore modules are connected respectively with output terminals of the output module, the load output module and the auxiliary output module, and when the reset enhancing module is turned on by the reset enhancing control module, the input terminal and the output terminal of each of the restore modules are connected with each other.

Further, each of the restore modules comprises a transistor, a first terminal of the transistor is connected with the input terminal of the restore module, a second terminal of the transistor is connected with the output terminal of the restore module, and a control terminal of the transistor is connected with the control terminal of the restore module.

Further, the output module comprises a transistor, and each of the transistors contained in the shift register unit is an N-type transistor.

The present invention also provides a gate driving circuit comprising a plurality of shift register units of any of above mentioned, the gate driving circuit further comprises at least one clock signal line, and the input terminals of the output modules in the respective shift register units are connected with the same clock signal line.

Further, the input terminal of the input module in the shift register unit in the first stage among the plurality of shift register units is connected with a starting signal input terminal.

Further, the second receiving terminal of the reset control module in each of the shift register units is connected with the second control terminal thereof.

Further, when the input module of each of the shift register units comprises a transistor combination consisting of two transistors connected in series, the control terminal of the transistor connected with the first node in the input module is connected with another clock signal line, the another clock signal line receives a clock signal with a phase contrary to that of the clock signal in the clock signal line connected with the output module.

The present invention also provides a method of driving the shift register unit of any of above mentioned, comprising: after, in response to a received signal of multiple pulses to be shifted, outputting a shifted signal with the same number of pulses, applying a control signal on the control terminal of the reset control module to turn on the reset module for resetting the first node.

Further, when the shift register unit comprises a first control terminal and a second control terminal, the method comprises: after outputting, in response to the received signal of multiple pulses to be shifted, a shifted signal with the same number of pulses, receiving a second level by the first control terminal and a first level by the second control terminal.

Further, the first level is consistent with the pulse level, the second level is consistent with the non-pulse level, the method comprises: receiving a signal to be shifted by the first control terminal of the reset control module, receiving a shifted signal outputted by the shift register unit in the next stage through the second control terminal of the reset control module, when the first control terminal receives a pulse level, receiving the reset-off level by the first receiving terminal, and when the first control terminal receives a non-pulse level and the second control terminal receives a pulse level, receiving the reset-on level by the second receiving terminal.

Further, when the shift register unit comprises a reset enhancing module and a reset enhancing control module, the method further comprises: after the reset module resets the first node to be at the output-off level capable of turning off the output module, applying a control signal on the control terminal of the reset enhancing control module to turn on the reset enhancing control module.

Further, when the shift register unit comprises a third control terminal, the method further comprises: connecting the second control terminal of the reset enhancing control module with a third clock signal input terminal, connecting the third control terminal with a fourth clock signal input terminal, so that the output terminal of the reset enhancing control module is alternatively connected with the first receiving terminal and the second receiving terminal of the reset enhancing control module.

Further, when the shift register unit comprises a pinch-off module, the method further comprises: when the shifted signal outputted by the shift register unit is at a pulse level, applying a control signal to turn on the pinch-off module.

The shift register unit of the present invention comprises the input module, the output module, the reset module and the reset control module, wherein the output terminal of the input module, the control terminal of the output module and the output terminal of the reset module are connected with the first node, the output terminal of the reset control module is connected with the control terminal of the reset module for turning on the reset module under the control of control signal received by the control terminal of the reset control module to reset the first node, so that the output module outputs a shifted signal with multiple pulses before the first node is reset. According to technical solutions of the present invention, a gate driving signal with multiple pulses can be outputted by one shift register unit.

DETAILED DESCRIPTION OF THE EMBODIMENTS

In order to make purposes, technical solutions and advantages of embodiments of the present invention more clearly, clear and complete descriptions of technical solutions in embodiments of the present invention will be given below in conjunction with drawings in embodiments of the present invention. Obviously, the described embodiments are only part of embodiments of the present invention, rather than all of embodiments of the present invention. Based on embodiments of the present invention, other embodiments obtained by ordinary skilled persons in the art without any creative work also fall within the protection scope of the present invention.

First Embodiment

Figure 1A:
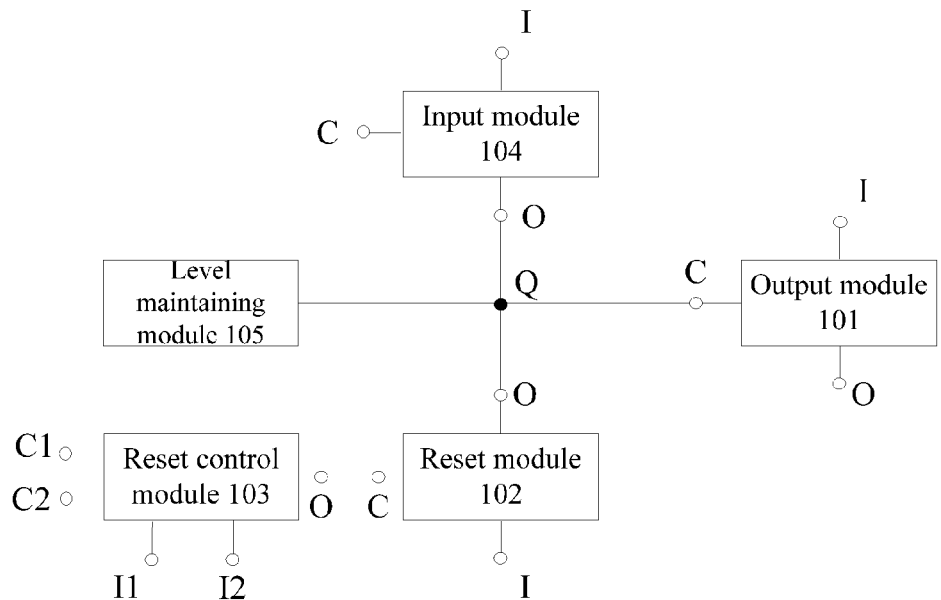
FIG. 1A is a structural diagram of a shift register unit in a first embodiment of the present invention.

The first embodiment of the present invention provides a shift register unit, as shown in FIG. 1A, comprising: an input module 104, an output module 101, a reset module 102 and a reset control module 103, wherein an output terminal of the input module 104, a control terminal of the output module 101 and an output terminal of the reset module 102 are connected with a first node Q, an input terminal of the input module 104 is used for receiving a signal to be shifted, an output terminal of the reset control module 103 is connected with a control terminal of the reset module 102, so that the reset module 102 resets the first node Q under the control of control signal received by a control terminal of the reset control module 103, and thus the output module 101 outputs a shifted signal with multiple pulses.

In a specific implementation, after the output module 101 of the shift register unit outputs, in response to a received signal of a plurality of pulses to be shifted, a shifted signal with the same number of pulses, a control signal may be applied on the control terminal of the reset control module 103 to turn on the reset module 102 to reset the first node Q, and in this way, the output module 101 is capable of outputting a plurality of pulses before the first node Q is reset.

For distinction, in the figures, the control terminals of the modules are represented by C, the input terminals or the receiving terminals of the modules are represented by I, the output terminals of the modules are represented by O, and the $x^{th}$ input terminal or receiving terminal is represented by Ix and the $x^{th}$ control terminal is represented by Cx.

The shift register unit of the present invention is capable of outputting a shifted signal with multiple pulses as a gate driving signal.

In a specific implementation, the control terminal of the reset control module 103 includes a first control terminal C1 and a second control terminal C2, so that the reset module 102 is controlled to be turned off when the first control terminal C1 receives a first level, and the reset module 102 is controlled to be turned on to reset the first node Q1 when the first control terminal C1 receives a second level and the second control terminal C2 receives the first level, thereby the output module 101 outputs a shifted signal with multiple pulses before the first node Q is reset by the reset module 102. FIG. 1A shows a case that the reset control module 103 comprises two control terminals (C1, C2) and two receiving terminals (I1, I2).

In a specific implementation, when the first control terminal C1 of the reset control module 103 receives the first level, the reset module 102 is controlled to be not turned on, and when the first control terminal C1 and the second control terminal C2 of the reset control module 103 receives the second level, the reset module 102 is also controlled to be not turned on, only when the first control terminal C1 of the reset control module 103 receives the second level and the second control terminal C2 of the reset control module 103 receives the first level, the reset module 102 is controlled to be turned on. Thus, the first control terminal C1 may receive a signal to be shifted, and the second control terminal C2 may receive a shifted signal outputted by the shift register unit in the next stage. Here, the shifted signal outputted by the shift register unit in the present stage is received by the input terminal of the shift register unit in the next stage. As an example, pulse levels of the signal to be shifted and the shifted signal outputted by the shift register unit in the next stage are the first levels, non-pulse levels are the second levels, when the signal to be shifted is at the pulse level in the $(2N-1)^{th}$ period (assume that N is the number of the pulses in the signal to be shifted), the reset module 102 is turned off, and when the signal to be shifted is at the non-pulse level in the $2N^{th}$ period, the shifted signal outputted by the shift register unit in the next stage is also at the non-pulse level (the signal to be shifted by the shift register unit in the present stage and the shifted signal outputted by the shift register unit in the next stage are different by two clock), the reset module 102 is still not turned on at this time. The reset module 102 is turned on only in the $(2N+1)^{th}$ period after the output module 101 outputs N pulses, at this time, the signal to be shifted is at the non-pulse level, and the shifted signal outputted by the shift register in the next stage is at the last pulse level. In this way, the shift register in the present stage outputs a shifted signal with multiple pulses before the reset module 102 is turned on to reset the first node Q.

Here, the output module 101 may be consistent with the output module of the shift register unit in the prior art, and is the module for outputting the shifted signal. In a specific implementation, the input terminal I of the output module 101 generally receives a clock signal, and when the first node Q is set to be at a level capable of turning on the output module 101, a section of the clock signal, which constitutes the shifted signal, is cut out and outputted. Then, when the first node Q is reset, the output module 101 is turned off and does not output the shifted signal. Of course, in practical applications, the output module 101 may be any other module capable of outputting the shifted signal, which will not be described in detail here.

Here, the reset module 102 also may be consistent with the reset module in the prior art, and is a module for resetting the first node Q. In a specific implementation, the receiving terminal I of the reset module 102 may receive the output-off level capable of turning off the output module 101, and when the reset module 102 is turned on, the output-off level is applied on the first node Q to reset the first node Q, thus the output module 101 is turned off.

At this time, the output terminal O of the input module 104 in the shift register unit is connected with the first node Q, so that the first node Q is set to be at the output-on level capable of turning on the output module 101 when the received signal to be shifted is at the pulse level.

Further, the shift register unit may further comprise a level maintaining module 105 as shown in FIG. 1A, and the level maintaining module 105 is connected with the first node Q for maintaining the level of the first node Q when the input module 104 and the reset module 102 are turned off.

The pulse level mentioned in the present invention may specifically refer to the level corresponding to the pulse of the shifted signal. For example, if the pulse of the shifted signal is a positive pulse, the pulse level is a high level, and the non-pulse level is a low level, otherwise, if the pulse of the shifted signal is a negative pulse, the pulse level is a low level, and the non-pulse level is a high level.

By this way, the level maintaining module 105 is capable of recording the pulse level of the shifted signal, and enables the output module 101 to be turned on in accordance with the recorded pulse level to output the shifted signal.

In a specific implementation, the first control terminal C1 of the reset control module 103 is connected with an input terminal for inputting the signal to be shifted for receiving the signal STU to be shifted, the second control terminal C2 of the reset control module 103 is connected with an output terminal for outputting the shifted signal of the shift register unit in the next stage for receiving the shifted signal STD outputted by the shift register unit in the next stage, wherein pulse levels of the signal to be shifted and the shifted signal are consistent with the first level, and non-pulse levels of the signal to be shifted and the shifted signal are consistent with the second level.

In the period of outputting the shifted signal by the shift register unit in the present stage, when the signal to be shifted by the shift register unit in the present stage is at the pulse level, the reset-off level received by the first receiving terminal I1 of the reset control module 103 is further received by the control terminal of the reset module 102, so that the reset module 102 is turned off; when the signal to be shifted by the shift register in the present stage is at the non-pulse level and the shifted signal outputted by the shift register unit in the next stage is also at the non-pulse level, the reset module 102 is still not turned on; when the shifted signal outputted by the shift register unit in the next stage is at the last pulse level, the signal to be shifted by the shift register in the present stage is no longer at the pulse level, at this time, the reset-on level received by the second receiving terminal I2 of the reset control module 103 is further received by the control terminal C of the reset module 102, so that the reset module 102 is turned on to reset the first node Q. Then, the output module 101 of the shift register in the present stage is turned off and does not output the pulse level. By this way, the first node Q is kept in on state in multiple clock signals, thus the output module 101 outputs a plurality of pulses before the first node Q is reset.

In a specific implementation, the first receiving terminal I1 of the reset control module 103 is connected with a first common electrode, a first clock signal input terminal or the output terminal of shifted signal of the shift register unit, the first common electrode is at a level consistent with the reset-off level, the first clock signal input terminal receives a clock signal at the reset-off level when the first receiving terminal I1 of the reset control module 103 is connected with the output terminal O of the reset control module 103; the second receiving terminal I2 of the reset control module 103 is connected with a second common electrode, the output terminal of shifted signal of the shift register unit in the next stage or a second clock signal input terminal, the second common electrode is at a level consistent with the reset-on level, the second clock signal input terminal receives a clock signal at the reset-on level when the second receiving terminal I2 of the reset control module 103 is connected with the output terminal O of the reset control module 103.

Of course, in practical applications, the first receiving terminal I1 of the reset control module 103 also may be connected with any other input terminal, as long as the first receiving terminal I1 is at the reset-off level when the first receiving terminal I1 of the reset control module 103 is connected with the output terminal O, the respective technical solutions of the present invention can be achieved, accordingly, corresponding solutions should fall within the protection scope of the present invention.

Figure 2:
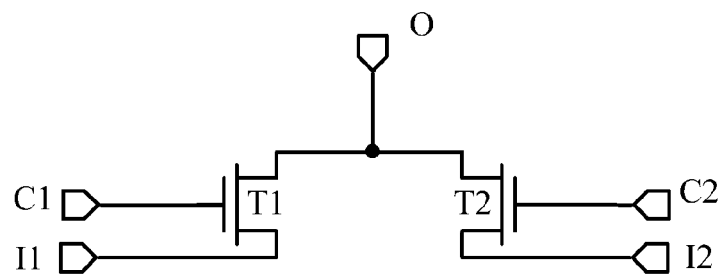
FIG. 2 is a structural diagram of a possible reset control module in the first embodiment of the present invention.

In a specific implementation, the specific structure of the reset control module 103, as shown in FIG. 2, may comprise: a transistor T1 and a transistor T2, the transistor T1 and the transistor T2 are turned on when the first level is received by gates (control terminals) thereof and turned off when the second level is received by gates thereof, wherein, a first terminal of the transistor T1 is connected with the first receiving terminal I1 of the reset control module 103, a control terminal of the transistor T1 is connected with the first control terminal C1 of the reset control module 103, a second terminal of the transistor T1 is connected with the output terminal O of the reset control module 103; a first terminal of the transistor T2 is connected with the second receiving terminal I2 of the reset control module 103, a control terminal of the transistor T2 is connected with the second control terminal C2 of the reset control module 103, a second terminal of the transistor T2 is connected with the output terminal O of the reset control module 103, the transistor T1 has a channel width-to-length ratio larger than that of the transistor T2.

Since the transistor T1 has a larger channel width-to-length ratio, when the transistor T1 is turned on, no matter whether the transistor T2 is turned on or not, the output terminal O of the reset control module 103 outputs a level consistent with that of the first receiving terminal I1 connected with the transistor T1, that is, the reset-off level; when the transistor T1 is turned off and the transistor T2 is turned on, the output terminal O of the reset control module 103 outputs a level consistent with that of the second receiving terminal I2.

Of course, in practical applications, the reset control module 103 may be of other structure, the protection scope of the present invention is not limited by the structure shown in FIG. 2.

Figure 1B:
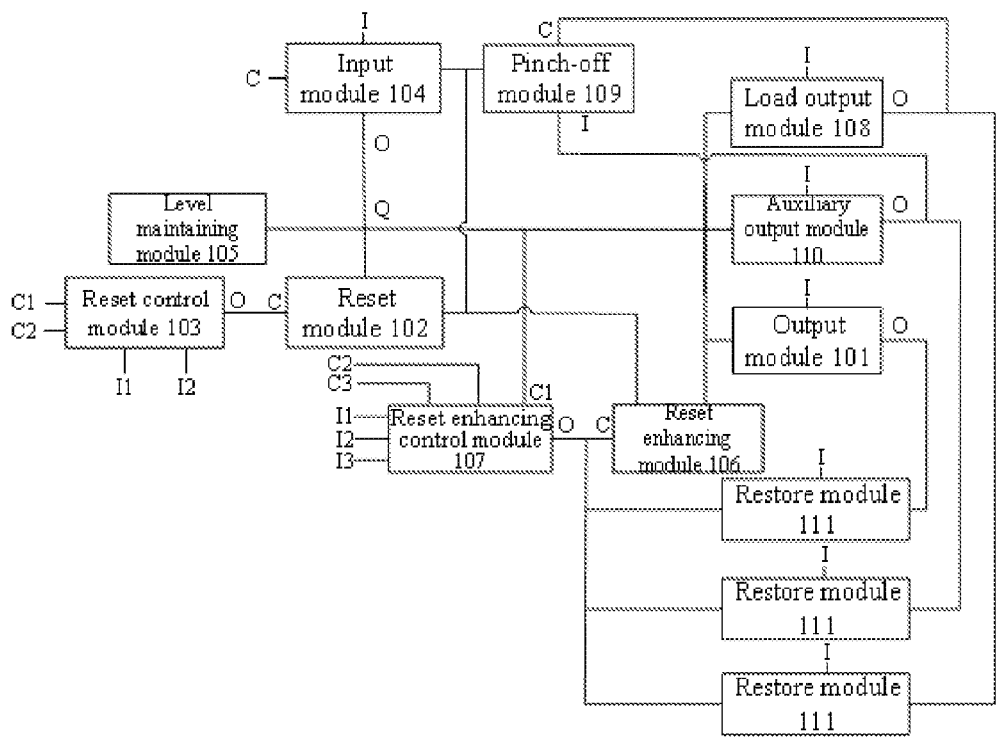
FIG. 1B is a structural diagram of another shift register unit in the first embodiment of the present invention.

In a specific implementation, as shown in FIG. 1B, the shift register unit may further comprise a reset enhancing module 106 and a reset enhancing control module 107, wherein, an output module of the reset enhancing module 106 is connected with the first node Q for resetting the level of the first node Q as the output-off level, an output terminal of the reset enhancing control module 107 is connected with a control terminal of the reset enhancing module 106 for turning on the reset enhancing module 106 to continue to reset the first node Q under the control of control signal received by a control terminal of the reset enhancing control module 107 after the level of the first node Q is reset to be the output-off level by the reset module 102.

In this way, after the reset module 102 resets the first node Q to be at the output-off level, the reset enhancing module 106 continues to reset the first node Q to ensure the first node Q is at the output-off level, thus the first node Q is avoided to restore to be at the output-on level due to leakage current of the input module 104, it is ensured that the output module 101 does not output the pulse level after outputting the shifted signal.

In a specific implementation, the reset enhancing control module 107 may comprise a first receiving terminal and a second receiving terminal, a first control terminal and a second control terminal, the second receiving terminal is used for receiving a reset-enhancing-on level capable of turning on the reset enhancing module 106, the first receiving terminal is used for receiving a reset-enhancing-off level capable of turning off the reset enhancing module 106.

The first control terminal of the reset enhancing control module 107 is connected with the first node Q for connecting the first receiving terminal and the output when the first node Q is at the output-on level, and connecting the second receiving terminal and the output terminal when the second control terminal receives a respective active level, the output terminal outputs a level consistent with that of the first receiving terminal when the output terminal is connected with both the first receiving terminal and the second receiving terminal.

Since the first receiving terminal and the output terminal of the reset enhancing control module 107 are connected with each other when the first node Q is at the output-on level, thus when the output module 101 outputs the shifted signal, the level of the output terminal of the reset enhancing control module 107 is consistent with that of the first receiving terminal, and will not reset the first node Q. However, after the reset module 102 resets the first node Q as the output-off level, the first receiving terminal and the output terminal of the reset enhancing control module 107 are no longer connected with each other, in accordance with the signal applied on the second control terminal, the second receiving terminal and the output terminal are timely connected with each other, at this time, the output terminal of the reset enhancing control module 107 is at the reset-enhancing-on level, so that the reset enhancing module 106 is turned on to continue to reset the first node Q.

In a specific implementation, the second receiving terminal and the second control terminal of the reset enhancing control module 107 may receive a clock signal, and when the clock signal is at the reset-enhancing-on level, the second receiving terminal and the output terminal are connected with each other.

The reset enhancing control module 107 may further comprise a third control terminal and a third receiving terminal, the third receiving terminal is used for receiving the reset-enhancing-on level, the reset enhancing control module 107 is suitable for connecting the third receiving terminal with the output terminal when the third control terminal receives a respective active level, and the output terminal outputs a level consistent with that of the first receiving terminal when the output terminal is connected with both the first receiving terminal and the third receiving terminal.

Figure 3:
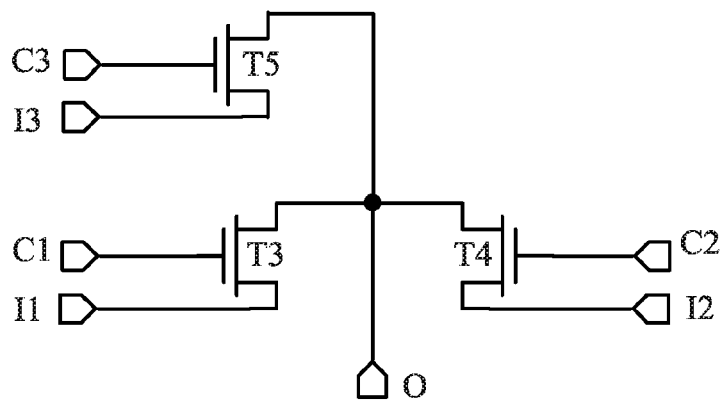
FIG. 3 is a structural diagram of a possible reset enhancing control module in the first embodiment of the present invention.

In a specific implementation, as shown in FIG. 3, the reset enhancing control module 107 comprising the third control terminal and the third receiving terminal may comprise a transistor T3, a transistor T4 and a transistor T5. A control terminal of the transistor T3 is connected with the first control terminal C1 of the reset enhancing control module 107, a first terminal of the transistor T3 is connected with the first receiving terminal I1 of the reset enhancing control module 107, a second terminal of the transistor T3 is connected with the output terminal O of the reset enhancing control module 107, the first terminal and the second terminal of the transistor T3 is connected with each other when the first control terminal C1 of the reset enhancing control module 107 receives the output-on level; a control terminal of the transistor T4 is connected with the second control terminal C2 of the reset enhancing control module 107, a first terminal of the transistor T4 is connected with the second receiving terminal I2 of the reset enhancing control module 107, a second terminal of the transistor T4 is connected with the output terminal O of the reset enhancing control module 107; a control terminal of the transistor T5 is connected with the third control terminal C3 of the reset enhancing control module 107, a first terminal of the transistor T5 is connected with the third receiving terminal I3 of the reset enhancing control module 107, a second terminal of the transistor T5 is connected with the output terminal O of the reset enhancing control module 107, wherein the transistor T4 and the transistor T5 respectively correspond to active levels contrary to each other, or both the second receiving terminal I2 and the third receiving terminal I3 are used for receiving clock signals, and the second receiving terminal I2 receives a clock signal with a phase contrary to that of clock signal received by the third receiving terminal I3. Here, the active level refers to a level at which the respective transistor is turned on.

In a specific implementation, as shown in FIG. 1B, the shift register unit may further comprise: a load output module 108, a control terminal of the load output module 108 is connected with the first node Q for outputting the shifted signal when the first node Q is at the output-on level.

In a specific implementation, the structure of the load output module 108 may be consistent with that of the output module 101. In this way, the shifted signal outputted by the load output module 108 may be used for other control terminals (for example, the input terminal of the shift register unit in the next stage), avoiding other control terminals from connecting with the output terminal of the output module 101 to reduce the pulse level outputted by the output module 101.

In a specific implementation, the load output module 108 may comprise a transistor, a first terminal of the transistor is connected with an input terminal of the load output module 108, a second terminal of the transistor is connected with an output terminal of the load output module 108, and a control terminal (gate) of the transistor is connected with the control terminal of the load output module 108.

In a specific implementation, as shown in FIG. 1B, the shift register unit may further comprise a pinch-off module 109 for pinching off the input module 104 and/or the reset module 102 and/or the reset enhancing module 106 when the shifted signal outputted is at a pulse level.

By this way, when the output module 101 or the load output module 108 outputs the pulse level, charges of the first node Q maintained by the level maintaining module 105 are avoided from flowing to the input module 104/the reset module 102/the reset enhancing module 106 to affect the level of the first node Q, the pulse level outputted by the output module 101 is ensured to be in a better waveform.

Further, as shown in FIG. 1B, the shift register unit may further comprise an auxiliary output module 110, wherein a control terminal of the auxiliary output module 110 is connected with the first node Q for outputting the shifted signal when the first node Q is at the output-on level, the shifted signal is at a pulse level consistent with the output-on level. At this time, each of the input module 104, the reset module 102 and the reset enhancing module may comprise a transistor combination consisting of two transistors connected in series. A control terminal of the pinch-off module 109 is connected with the output terminal of the load output module 108, an input terminal of the pinch-off module 109 is connected with an output terminal of the auxiliary output module 110, an output terminal of the pinch-off module 109 is connected with a connection node between the two transistors connected in series in the transistor combination, and when the output terminals of the load output module 108 and the auxiliary output module 110 output the shifted signal at the pulse level, the input terminal and the output terminal of the pinch-off module 109 are connected with each other, so that the connection node between the two transistors connected in series in the transistor combination is at a level consistent with the output-on level.

The pinch-off module 109 may comprise a transistor, a first terminal of the transistor is connected with the input terminal of the pinch-off module 109, a second of the transistor is connected with the output terminal of the pinch-off module 109, and a control terminal of the transistor is connected with the control terminal of the pinch-off module 109.

The auxiliary output module 110 may comprise a transistor, a first terminal of the transistor is connected with the input terminal of the auxiliary output module 110, a second terminal of the transistor is connected with the output terminal of the auxiliary output module 110, and a control terminal of the transistor is connected with the output terminal of the auxiliary output module 110.

As shown in FIG. 1B, the shift register unit may further comprise three restore modules 111 respectively for restoring output terminals of the output module 101, the load output module 108 and the auxiliary output module 110 after the output module 101 outputs the shifted signal, so that the output terminals are restored to the non-pulse level.

In a specific implementation, control terminals of the three restore modules 111 are connected with the output terminal of the reset enhancing control module 107, input terminals of the three restore modules 111 are used for receiving the level contrary to the pulse level, output terminals of the three restore modules 111 are connected respectively with output terminals of the output module 101, the load output module 108 and the auxiliary output module 110, and when the reset enhancing module 106 is turned on by the reset enhancing control module 107, the input terminal and the output terminal of each of the restore modules 111 are connected with each other.

In a specific implementation, each of the restore modules 111 comprises a transistor, a first terminal of the transistor is connected with the input terminal of the restore module 111, a second terminal of the transistor is connected with the output terminal of the restore module 111, and a control terminal of the transistor is connected with the control terminal of the restore module 111.

Each of the input module 104 and the output module 101 may be a transistor.

The transistors contained in the shift register unit may be N-type transistors, and the level maintaining module 105 may be a capacitor. At this time, each of the modules is turned on at a high level and turned off at a low level.

By this way, the manufacturing process is unified and the manufacturing complexity is reduced.

Of course, in practical applications, a part of the transistors may be P-type transistors. For example, in embodiments of the present invention, if the transistors in the reset control module 103 are P-type transistors, technical solutions of the present invention can also be achieved, and corresponding solutions should fall within the protection scope of the present invention.

On the other hand, the present invention also provides a method of driving the shift register unit of any of above mentioned, the method comprising: after outputting, in response to a received signal of multiple pulses to be shifted, a shifted signal with the same number of pulses, applying a control signal on the control terminal of the reset control module 103 to turn on the reset module 102 for resetting the first node Q.

By this way, when the number of the pulses in the shifted signal outputted is the same as that of the pulses in the signal to be shifted, the reset module 102 is timely turned on to reset the first node Q. Thus, the output module 101 outputs the shifted signal with multiple pulses before the first node Q is reset.

In a specific implementation, when the reset control module 103 comprises two control terminals (C1, C2), the method specifically comprises: after outputting, in response to the received signal of multiple pulses to be shifted, a shifted signal with the same number of pulses, receiving a second level by the first control terminal C1 and a first level by the second control terminal C2.

Further, the first level is consistent with the pulse level, the second level is consistent with the non-pulse level, at this time, the method may specifically comprise: receiving a signal to be shifted by the first control terminal C1 of the reset control module 103, receiving the shifted signal outputted by the shift register unit in the next stage through the second control terminal C2 of the reset control module 103, when the first control terminal C1 of the reset control module 103 receives the pulse level, receiving the reset-off level by the first receiving terminal I1 of the reset control module 103, and when the first control terminal C1 of the reset control module 103 receives the non-pulse level and the second control terminal C2 receives the pulse level, receiving the reset-on level by the second receiving terminal I2 of the reset control module 103.

In this way, the complexity of reset control is reduced.

When the shift register unit comprises a reset enhancing module 106 and a reset enhancing control module 107, the method further comprises: after the reset module 102 resets the first node Q to be at the output-off level capable of turning off the output module 101, applying a control signal on the control terminal of the reset enhancing control module 107 to turn on the reset enhancing control module 107.

Generally, the duration that the first node Q is reset by the reset module 102 is short, and after the first node Q is reset, the reset module 102 is no longer turned on. However, due to problems of the devices themselves, the level of the first node Q may be changed due to leakage current of the input module 104, resulting that the output module 101 is again turned on to output pulses. By providing the reset enhancing module 106 and the reset enhancing control module 107, after the reset module 102 resets the first node Q to the output-off level capable of turning off the output module 101, the first node Q is continued to be reset by the reset enhancing module 106, thus the change of the level of the first node Q is avoided.

Specifically, when the reset enhancing control module 107 comprises a third control terminal and a third receiving terminal, the method further comprises: connecting the second control terminal of the reset enhancing control module 107 with a second clock signal input terminal, connecting the third control terminal with a third clock signal input terminal, so that the output terminal of the reset enhancing control module 107 is alternatively connected with the first receiving terminal and the second receiving terminal of the reset enhancing control module 107.

By this way, after the reset module 102 resets the first node Q to the output-off level capable of turning off the output module 101, the reset enhancing module 106 is turned on to continuously reset the first node Q to be at the output-off level.

In a specific implementation, when the shift register unit further comprises a pinch-off module 109, the method further comprises: when the shifted signal outputted by the shift register unit is at the pulse level, applying a control signal to the pinch-off module 109 to turn on the pinch-off module 109.

Second Embodiment

Figure 4:
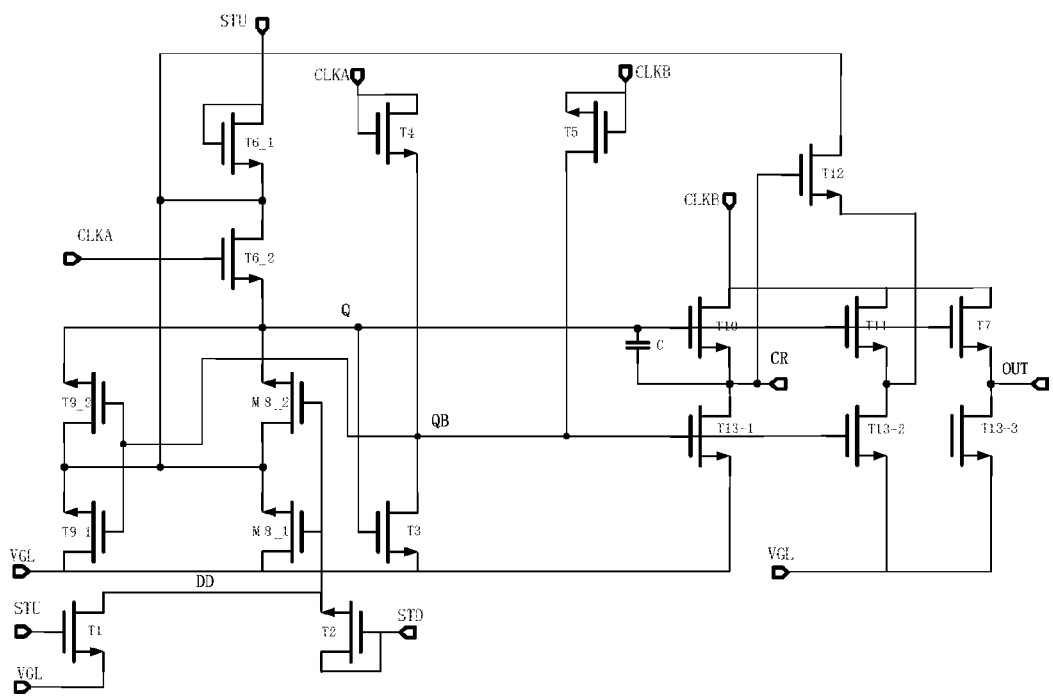
FIG. 4 is a circuit configuration diagram of a shift register unit in a second embodiment of the present invention.

The operation principle of the shift register unit of the present invention is illustrated below in conjunction with specific circuits and a possible method of driving the same. As shown in FIG. 4, the shift register unit of the present invention may comprise eighteen N-type transistors and a capacitor C.

As shown in FIG. 4, the input module 104 in FIG. 1A consists of two transistors T6-1 and T6-2 connected in series, a source (represented by S in the figure) of the transistor T6-1 is connected with a drain (represented by D in the figure) of the transistor T6-2, a drain of the transistor T6-1 is connected with the input terminal of signal to be shifted for receiving the signal STU to be shifted, and a gate of the transistor T6-1 is also connected with the input terminal of signal to be shifted; a gate of the transistor T6-2 is connected with a clock signal input terminal for receiving a clock signal CLKA, and a source of the transistor T6-2 is connected with the node Q.

The output module 101 comprises a transistor T7, a drain of the transistor T7 is connected with another clock signal input terminal for receiving a clock signal CLKB, a source of the transistor T7 is connected with the node OUT for outputting the shifted signal, and a gate of the transistor T7 is connected with the node Q. Here, the clock signals CLKA and CLKB have phases contrary to each other.

The reset module 102 comprises two transistors T8-1 and T8-2, a source of the transistor T8-2 is connected with a drain of the transistor T8-1, a source of the transistor T8-1 is connected with a common low voltage electrode VGL capable of resetting the node Q to a low level, a drain of the transistor T8-2 is connected with the node Q. both gates of the transistors T8-1 and T8-2 are connected with the node DD.

The reset control module 103 comprises transistors T1 and T2, wherein the transistor T1 has a larger channel width-to-length ratio than that of the transistor T2, a source of the transistor T1 is connected with the common low voltage electrode VGL, and a gate of the transistor T1 is also connected with the input terminal of signal to be shifted for receiving the signal STU to be shifted; a source and a gate of the transistor T2 are connected with the output terminal of the shift register unit in the next stage for receiving the shifted signal STD outputted by the shift register unit in the next stage. Both drains of the transistors T1 and T2 are connected with the node DD.

FIG. 4 also shows structures of the reset enhancing module 106 and the reset enhancing control module 107. Similar to the structure of the reset module 102, the reset enhancing module 106 comprises transistors T9-1 and T9-2, a source of the transistor T9-2 is connected with a drain of the transistor T9-1, a source of the transistor T9-1 is connected with the common low voltage electrode VGL capable of resetting the first node Q to the low level, a drain of the transistor T9-2 is connected with the first node Q, and both gates of the transistors T9-1 and T9-2 are connected with the node Qb.

The reset enhancing control module 107 comprises transistors T3, T4 and T5, wherein a gate of the transistor T3 is connected with the node Q, a drain of the transistor T3 is connected with the node Qb, and a source of the transistor T3 is connected with the common low voltage electrode VGL; a gate and a drain of the transistor T4 are connected with a clock signal input terminal for receiving the clock signal CLKA, a source of the transistor T4 is connected with the node Qb; a gate and a drain of the transistor T5 are connected with the another clock signal input terminal for receiving the clock signal CLKB, and a source of the transistor T5 is connected with the node Qb. The channel width-to-length ratio of the transistor T3 is larger than those of transistors T4 and T5.

FIG. 4 also shows a circuit configuration of the load output module 108. The load output module 108 comprises a transistor T10, wherein a drain of the transistor T10 is connected with the another clock signal input terminal for receiving the clock signal CLKB, a source of the transistor T10 is connected with a load output terminal CR for outputting the shifted signal. Meanwhile, the source of the transistor T10 is also connected with an electrode of the capacitor C, which is not connected with the node Q.

Similarly, FIG. 4 also shows a circuit configuration of the auxiliary output module 110. The auxiliary output module 110 comprises a transistor T11, wherein a drain of the transistor T1 is connected with the another clock signal input terminal for receiving the clock signal CLKB, and a source of the transistor T11 is connected with the node N1.

FIG. 4 also shows a circuit configuration of the pinch-off module 109. The pinch-off module 109 comprises a transistor T12, wherein a source of the transistor T12 is connected with the node N1, a gate of the transistor T12 is connected with the load output terminal CR in the figure, and a drain of the transistor T12 is connected with a connection node between the two transistors connected in series in the reset module 102 (a connection node between the source of the transistor T8-2 and the drain of the transistor T8-1 connected with each other), a connection node between the two transistors connected in series in the input module 104 (a connection node between the source of the transistor T6-1 and the drain of the transistor T6-2 connected with each other), and a connection node between the two transistors connected in series in the reset enhancing module 106 (a connection node between the source of the transistor T9-2 and the drain of the transistor T9-1 connected with each other).

FIG. 4 also shows a circuit configuration of the three restore modules 111. The three restore modules 111 respectively correspond to the transistors T13-1, T13-2 and T13-3, wherein a drain of the transistor T13-1 is connected with the load output terminal CR, a source of the transistor T13-1 is connected with the common low voltage electrode VGL, and a gate of the transistor T13-1 is connected with the node Qb in the figure; a drain of the transistor T13-2 is connected with the node N1, a source of the transistor T13-2 is connected with the common low voltage electrode VGL, and a gate of the transistor T13-2 is connected with the node Qb in the figure; a drain of the transistor T13-3 is connected with the node OUT, a source of the transistor T13-3 is connected with the common low voltage electrode VGL, and a gate of the transistor T13-3 is connected with the node Qb in the figure.

Figure 5:
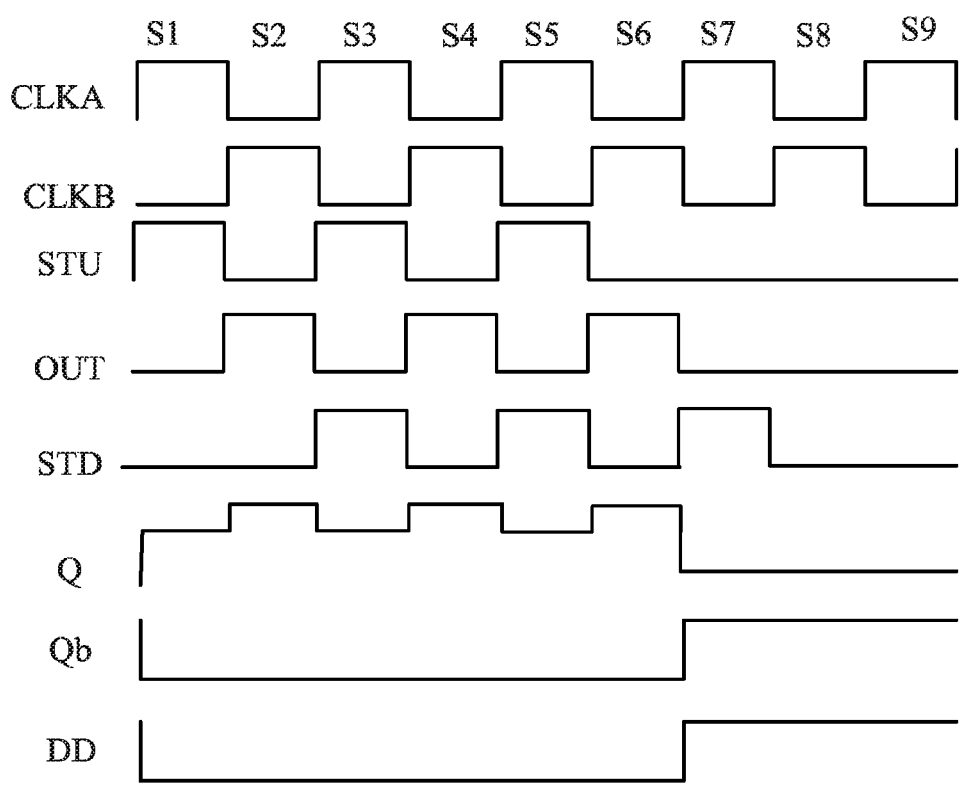
FIG. 5 is a timing diagram of key signals and node levels during operation of the circuit of FIG. 4.

The method for driving the circuit of FIG. 4 is described in detail below in conjunction with FIG. 5. FIG. 5 is a timing diagram of levels of key nodes during operation of the shift register unit circuit of FIG. 4. It is assumed that the signal STU with three pulses is shifted by the circuit of FIG. 4 to obtain the shifted signal with three pulses, wherein the pulses of the shifted signal are at the high level.

In the first period S1 (each period corresponds to one clock), the signal STU to be shifted is at the high level, the outputted shifted signal OUT is at the low level, the clock signal CLKA is at the high level, the clock signal CLKB is at the low level, and the signal STD is at the low level, at this time, both the transistors T6-1 and T6-2 are turned on, the high level of pulse of the signal STU is written into the node Q. The pull-up of the node Q results in the transistor T3 being turned on, although the transistor T4 is also turned on, since the channel width-to-length ratio thereof is smaller than that of the transistor T3, at this time, the level of the node Qb is pulled down to the level of the common low voltage electrode VGL, resulting in transistors T9-1 and T9-2 being turned off. In addition, since the signal STU is at the high level, resulting in that the node DD is at the level of the low voltage electrode VGL and transistors T8-1 and T8-2 are turned off, thus the level of the node Q will not influenced by the reset module 102 and the reset enhancing module 106. Meanwhile, since the node Qb is at the low level, the transistors T13-1, T13-2 and T13-3 are all turned off. In addition, the pull-up of the node Q also results in the transistors T7, T10 and T11 being turned on, but since the clock signal CLKB is at the low level, at this time, the nodes OUT, N1 and CR output the low level.

In the second period S2, the signal STU to be shifted is at the low level, the outputted shifted signal OUT is at the high level, the clock signal CLKA is at the low level, the clock signal CLKB is at the high level, and the signal STD is also at the low level. Since the signal STU is at the low level and the clock signal CLKA is at the low level, the two transistors T6-1 and T6-2 in the input module 104 are turned off. In addition, in the reset control module 103, the transistor T1 is turned off, since the signal STD is at the low level, the transistor T2 is also turned off, the node DD is still at the low level. Correspondingly, the transistors T8-1 and T8-2 are not turned on, and the level of the node Q is still not influenced. At this time, the transistors T7, T10 and T11 are continued to be turned on, each of the nodes OUT, N1 and CR outputs a level consistent with that of the clock signal CKLB, that is, the high level. Since the node Q is at the high level and the node Qb is still at the low level, transistors T13-1, T13-2 and T13-3 are still turned off, avoiding the nodes OUT, N1 and CR from being influenced to output the high level. Meanwhile, in the second period S2, since the load output terminal CR and the node N1 are at the high level, the transistor T12 is turned on, the source of the transistor T12 is at the high level, resulting in that all the connection node between the source of the transistor T6-1 and the drain of the transistor T6-2, the connection node between the source of the transistor T9-2 and the drain of the transistor T9-1, and the connection node between the source of the transistor T8-2 and the drain of the transistor T8-1 are at the high level, thus there is not enough potential difference between the node Q and these connection nodes, correspondingly, resulting in that the transistors T6-1, T8-2 and T9-2 are pinched off and will not influence on the level of the node Q. In addition, in the second period S2, since the load output terminal CR is connected with the terminal of the capacitor C not connected with the node Q, the level of the output terminal CR is further increased, capacitive bootstrap occurs at the node Q, the level of the node Q is further increased. At this time, the ideal value of level of the node Q is the absolute value of difference between the high level of the clock signal and the low level of the clock signal. Since the low level of the clock signal is generally negative, the level of the node Q is higher than the high level of the clock signal, ensuring the transistor T7 being turned on.

In the third period S3, the signal STU to be shifted is at the high level, the outputted shifted signal OUT is at the low level, the clock signal CLKA is at the high level, and the signal STD is at the high level. At this time, similar to the first period S1, the node Q is at the high level, the node Qb is at the low level, the node OUT still outputs the low level, transistors T9-1 and T9-2 are turned off, the transistors T13-1, T13-2 and T13-3 are turned off. Since the signal STU is at the high level, the node DD is reset to the low level. Transistors T8-1 and T8-2 are still not turned on, the node Q is still maintained at the high level. Correspondingly, in the fifth period S5, the states of the transistors and the levels of the key nodes are consistent with those in the third period S3.

Similarly, in the fourth period S4 and the sixth period S6, the states of the transistors and the levels of the key nodes are consistent with those in the second period S2. In the fourth period S4, all the nodes OUT, N1 and CR output one pulse, and in the sixth period S6, each of the nodes OUT, N1 and CR output one pulse again. After the sixth period S6, the number of pulses outputted reaches three, which is consistent with the number of pulses in the signal STU.

In the seventh period S7, the signal STU is at the low level, the clock signal CLKA is at the high level, the clock signal CLKB is at the low level, and the signal STD is at the high level, at this time, the transistor T1 is turned off, the transistor T2 is turned on, resulting in that the level of the node DD is pulled up. Transistors T8-1 and T8-2 are turned on, so that the level of the node Q is pulled down, the node Q is reset. Since the node Q is at the low level, resulting in that the transistor T3 is turned off, correspondingly, the level of the node Qb is depend on transistors T4 and T5. Since the clock signal CLKA is at the high level, the transistor T4 is turned on, the level of the node Qb is pulled up, transistors T9-1 and T9-2 are turned on, further ensuring that the level of the node Q is pulled down.

In the eighth period S8, both the signals STU and STD are at the low level, the clock signal CLKA is also at the low level, both the transistors T6-1 and T6-2 are turned off, the level of the node Q is still not pulled up. Thus, the transistor T3 is also not turned on, since the clock signal CLKB is at the high level at this time, the transistor T5 is turned on, the level of the node Qb is still at the high level, the transistors T9-1 and T9-2 are continued to be turned on, so that the level of the node Q is continued to be pulled down as the low level.

In the ninth period S9, both the signals STU and STD are at the low level, the transistor T6-1 is turned off, the level of the node Q is still not pulled up, and the transistor T3 is still not turned on. Since the clock signal CLKA is at the high level at this time, the transistor T4 is turned on, the node Qb is still at the high level, the transistors T9-1 and T9-2 are continued to be turned on, so that the level of the node Q is continued to be pulled down as the low level.

It can be seen that, in the same frame, after the seventh period S7, the level of the node Q will not be pulled up again, the transistor T3 will not be turned on. Since the transistors T4 and T5 are turned on alternatively, the node Qb is always at the high level, so that the transistors T9-1 and T9-2 are continued to be turned on, ensuring that the level of the node Q is kept to be pulled down as the low level. In addition, the node Qb is always at the high level, thus all the transistors T13-1, T13-2 and T13-3 are turned on, further ensuring that the levels of the output terminals CR, N1 and OUT are pulled down.

On the other hand, the present invention also provides a gate scanning circuit comprising a plurality of shift register units cascaded with each other, wherein the shift register unit may be any shift register unit in above embodiments.

In a specific implementation, the input terminal of the input module in the shift register unit in the present stage is connected with the output terminal of the output module, the load output module or the auxiliary output module in the shift register unit in the previous stage, the first control terminal of the reset control module is also connected with the output terminal of the output module, the load output module or the auxiliary output module in the shift register unit in the previous stage, the second control terminal of the reset control module is connected with the output terminal of the output module, the load output module or the auxiliary output module in the shift register unit in the next stage. The second receiving terminal of the reset control module in each shift register unit may be connected with the second control terminal thereof.

In the shift register unit circuit shown in FIG. 4, both the drain of the transistor T6-1 and the gate of the transistor T1 are connected with the shifted signal STU outputted by the shift register unit in the previous stage, the gate of the transistor T2 is connected with the shifted signal STD outputted by the shift register unit in the next stage. The source of the transistor T2 may be connected with the gate of the transistor T2, or may be connected directly with a common high level electrode.

In the above gate scanning circuit, the input terminal of the shift register unit in the first stage among the plurality of shift register units is connected with a starting signal input terminal, and the output terminal of the output module in the shift register unit in the last stage is not connected with any other shift register unit.

It should be understood that, the foregoing implementations are merely part of specific implementations of the present invention, but the protection scope of the present invention is not limited thereto. Various variations or substitutes which are easily conceivable for skilled persons in the art within the technical scope disclosed by the present invention also fall within the protection scope of the present invention. Therefore, the protection scope of the present invention shall be determined by the terms of the claims.

The invention claimed is:

1. A shift register unit, comprising an input module for receiving a signal to be shifted, the shift register unit further comprises:
    an output module,
    a reset module, and
    a reset control module,
wherein, an output terminal of the input module, a control terminal of the output module and an output terminal of the reset module are connected to a first node, an output terminal of the reset control module is connected with a control terminal of the reset module for turning on the reset module under the control of a control signal received by a control terminal of the reset control module to reset the first node, so that the output module outputs a shifted signal with multiple pulses before the first node is reset, and
wherein the control terminal of the reset control module includes a first control terminal and a second control terminal for turning off the reset module when the first control terminal receives a first level and turning on the reset module to reset the first node when the first control terminal receives a second level and the second control terminal receives the first level.

2. The shift register unit of claim 1, wherein, the output terminal of the input module is configured for setting the first node to be at an output-on level configured to turn on the output module when a received signal to be shifted is at a pulse level;
    the output module is configured for outputting a shifted signal when the first node is at the output-on level; and
    the reset module is configured for resetting the first node to be at an output-off level configured to turn off the output module after the output module outputs the shifted signal.

3. The shift register unit of claim 1, further comprising:
    a level maintaining module, which is connected with the first node and configured for maintaining level of the first node when the input module and the reset module are turned off.

4. The shift register unit of claim 1, wherein, the first control terminal of the reset control module is connected with an input terminal of signal to be shifted, and the second control terminal of the reset control module is connected with an output terminal of shifted signal of the shift register unit in the next stage, pulse levels of the signal to be shifted and the shifted signal are consistent with the first level, and non-pulse levels of the signal to be shifted and the shifted signal are consistent with the second level.

5. The shift register unit of claim 1, wherein, the reset control module comprises a first receiving terminal and a second receiving terminal, the second receiving terminal is used for receiving a reset-on level configured for turning on the reset module, and the first receiving terminal is used for receiving a reset-off level configured for turning off the reset module;
    the reset control module is configured for connecting the first receiving terminal with the output terminal thereof when the first control terminal receives the first level, and connecting the second receiving terminal with the output terminal thereof when the second control terminal receives the first level, the output terminal outputs a level consistent with that of the first receiving terminal when the output terminal is connected with both the first receiving terminal and the second receiving terminal.

6. The shift register unit of claim 5, wherein, the first receiving terminal of the reset control module is connected with a first common electrode, a first clock signal input terminal or the output terminal of shifted signal of the shift register unit, the first common electrode is at a level consistent with the reset-off level, the first clock signal input terminal receives a clock signal at the reset-off level when the first receiving terminal of the reset control module is connected with the output terminal of the reset control module;
    the second receiving terminal of the reset control module is connected with a second common electrode, the output terminal of shifted signal of the shift register unit in the next stage or a second clock signal input terminal, the second common electrode is at a level consistent with the reset-on level, the second clock signal input terminal receives a clock signal at the reset-on level when the second receiving terminal of the reset control module is connected with the output terminal of the reset control module.

7. The shift register unit of claim 5, wherein, the reset control module comprises a first transistor and a second transistor, both the first transistor and the second transistor are turned on when control terminals thereof receives the first level and turned off when control terminals thereof receives the second level,
    a first terminal of the first transistor is connected with the first receiving terminal of the reset control module, a control terminal of the first transistor is connected with the first control terminal of the reset control module, a second terminal of the first transistor is connected with the output terminal of the reset control module; a first terminal of the second transistor is connected with the second receiving terminal of the reset control module, a control terminal of the second transistor is connected with the second control terminal of the reset control module, a second terminal of the second transistor is connected with the output terminal of the reset control module,
    the first transistor has a channel width-to-length ratio larger than that of the second transistor.

8. The shift register unit of claim 2, further comprising: a reset enhancing module and a reset enhancing control module,
    an output terminal of the reset enhancing module is connected with the first node for resetting level of the first node, and an output terminal of the reset enhancing control module is connected with a control terminal of the reset enhancing module for turning on the reset enhancing module to continue to reset the first node under the control of control signal received by a control terminal of the reset enhancing control module after the level of the first node is reset to be the output-off level by the reset module.

9. The shift register unit of claim 8, wherein, the reset enhancing control module comprises a first receiving terminal and a second receiving terminal, a first control terminal and a second control terminal, the second receiving terminal is used for receiving a reset-enhancing-on level configured to turn on the reset enhancing module, the first receiving terminal is used for receiving a reset-enhancing-off level configured to turn off the reset enhancing module;

the first control terminal of the reset enhancing control module is connected with the first node for connecting the first receiving terminal and the output terminal thereof when the first node is at the output-on level, and connecting the second receiving terminal and the output terminal thereof when the second control terminal receives a respective active level, the output terminal outputs a level consistent with that of the first receiving terminal when the output terminal is connected with both the first receiving terminal and the second receiving terminal.

10. The shift register unit of claim 9, wherein, the reset enhancing control module further comprises a third control terminal and a third receiving terminal, the third receiving terminal is used for receiving the reset-enhancing-on level, the reset enhancing control module is configured for connecting the third receiving terminal with the output terminal when the third control terminal receives a respective active level, and the output terminal outputs a level consistent with that of the first receiving terminal when the output terminal is connected with both the first receiving terminal and the third receiving terminal.

11. The shift register unit of claim 10, wherein, the reset enhancing control module comprises a third transistor, a fourth transistor and a fifth transistor, a control terminal of the third transistor is connected with the first control terminal of the reset enhancing control module, a first terminal of the third transistor is connected with the first receiving terminal of the reset enhancing control module, a second terminal of the third transistor is connected with the output terminal of the reset enhancing control module, the first terminal of the third transistor is connected with the second terminal of the third transistor when the first control terminal of the reset enhancing control module receives the output-on level; a control terminal of the fourth transistor is connected with the second control terminal of the reset enhancing control module, a first terminal of the fourth transistor is connected with the second receiving terminal of the reset enhancing control module, a second terminal of the fourth transistor is connected with the output terminal of the reset enhancing control module; a control terminal of the fifth transistor is connected with the third control terminal of the reset enhancing control module, a first terminal of the fifth transistor is connected with the third receiving terminal of the reset enhancing control module, a second terminal of the fifth transistor is connected with the output terminal of the reset enhancing control module;

the fourth transistor and the fifth transistor respectively correspond to active levels contrary to each other, or both the second receiving terminal and the third receiving terminal are used for receiving clock signals, and the second receiving terminal receives a clock signal with a phase contrary to that of clock signal received by the third receiving terminal.

12. The shift register unit of claim 8, further comprising: a load output module, a control terminal of the load output module is connected with the first node for outputting the shifted signal when the first node is at the output-on level.

13. The shift register unit of claim 12, wherein, the load output module comprises a transistor, a first terminal of the transistor is connected with an input terminal of the load output module, a second terminal of the transistor is connected with an output terminal of the load output module, and a control terminal of the transistor is connected with the control terminal of the load output module.

14. The shift register unit of claim 12, further comprising a pinch-off module, which is turned on for pinching off the input module and/or the reset module and/or the reset enhancing module when the shifted signal outputted is at a pulse level.

15. The shift register unit of claim 14, further comprising:
an auxiliary output module, wherein a control terminal of the auxiliary output module is connected with the first node for outputting the shifted signal when the first node is at the output-on level, the shifted signal is at a pulse level consistent with the output-on level;
each of the input module, the reset module and the reset enhancing module comprises a transistor combination consisting of two transistors connected in series;
a control terminal of the pinch-off module is connected with the output terminal of the load output module, an input terminal of the pinch-off module is connected with an output terminal of the auxiliary output module, an output terminal of the pinch-off module is connected with a connection node between the two transistors connected in series in the transistor combination, and when the shifted signals output by the output terminals of the load output module and the auxiliary output module are at pulse level, the input terminal and the output terminal of the pinch-off module are connected with each other, so that the connection node between the two transistors connected in series in the transistor combination is at a level consistent with the output-on level.

16. The shift register unit of claim 14, wherein, the pinch-off module comprises a transistor, a first terminal of the transistor is connected with the input terminal of the pinch-off module, a second of the transistor is connected with the output terminal of the pinch-off module, and a control terminal of the transistor is connected with the control terminal of the pinch-off module.

17. The shift register unit of claim 15, wherein, the auxiliary output module comprises a transistor, a first terminal of the transistor is connected with the input terminal of the auxiliary output module, a second terminal of the transistor is connected with the output terminal of the auxiliary output module, and a control terminal of the transistor is connected with the output terminal of the auxiliary output module.

18. The shift register unit of claim 15, further comprising: three restore modules respectively for restoring output terminals of the output module, the load output module and the auxiliary output module after the output module outputs the shifted signal, so that the output terminals are restored to be at the non-pulse level.

19. The shift register unit of claim 18, wherein, control terminals of the three restore modules are connected with the output terminal of the reset enhancing control module, input terminals of the three restore modules are used for receiving the non-pulse level, output terminals of the three restore modules are connected respectively with output terminals of the output module, the load output module and the auxiliary output module, and when the reset enhancing module is turned on by the reset enhancing control module, the input terminal and the output terminal of each of the restore modules are connected with each other.

20. The shift register unit of claim 18, wherein, each of the restore modules comprises a transistor, a first terminal of the transistor is connected with the input terminal of the restore module, a second terminal of the transistor is connected with the output terminal of the restore module, and a control terminal of the transistor is connected with the control terminal of the restore module.

21. The shift register unit of claim 20, wherein, the output module comprises a transistor, and each of the transistors contained in the shift register unit is an N-type transistor.

22. A gate driving circuit comprising a plurality of shift register units of claim 1, further comprises at least one clock signal line, and the input terminals of the output modules in the respective shift register units are connected with the same clock signal line.

23. The gate driving circuit of claim 22, wherein, when each of the plurality of shift register units is provided such that the output terminal of the input module is configured for setting the first node to be at an output-on level configured to turn on the output module when a received signal to be shifted is at a pulse level, the output module is configured for outputting a shifted signal when the first node is at the output-on level, and the reset module is configured for resetting the first node to be at an output-off level configured to turn off the output module after the output module outputs the shifted signal, the input terminal of the input module in the shift register unit in the first stage is connected with a starting signal input terminal.

24. The gate driving circuit of claim 22, wherein, when each of the plurality of shift register units is provided such that the reset control module comprises a first receiving terminal and a second receiving terminal, the second receiving terminal is used for receiving a reset-on level configured to turn on the reset module, and the first receiving terminal is used for receiving a reset-off level configured to turn off the reset module and the reset control module is configured for connecting the first receiving terminal with the output terminal thereof when the first control terminal receives the first level, and connecting the second receiving terminal with the output terminal thereof when the second control terminal receives the first level, the output terminal outputs a level consistent with that of the first receiving terminal when the output terminal is connected with both the first receiving terminal and the second receiving terminal, the second receiving terminal of the reset control module in each of the shift register units is connected with the second control terminal thereof.

25. The gate driving circuit of claim 23, wherein, when the input module of each of the shift register units comprises a transistor combination consisting of two transistors connected in series, the control terminal of the transistor connected with the first node in the input module is connected with another clock signal line, the another clock signal line receives a clock signal with a phase contrary to that of the clock signal in the clock signal line connected with the output module.

26. A method of driving the shift register unit of claim 1, comprising:
after outputting, in response to a received signal of multiple pulses to be shifted, a shifted signal with the same number of pulses, applying a control signal on the control terminal of the reset control module to turn on the reset module for resetting the first node.

27. The method of claim 26, wherein, when the shift register unit is provided such that the control terminal of the reset control module includes a first control terminal and a second control terminal for turning off the reset module when the first control terminal receives a first level and turning on the reset module to reset the first node when the first control terminal receives a second level and the second control terminal receives the first level, the method comprises:
after outputting, in response to the received signal of multiple pulses to be shifted, a shifted signal with the same number of pulses, receiving a second level by the first control terminal and a first level by the second control terminal.

28. The method of claim 26, wherein, when the shift register unit is provided such that the reset control module comprises a first receiving terminal and a second receiving terminal, the second receiving terminal is used for receiving a reset-on level configured to turn on the reset module, and the first receiving terminal is used for receiving a reset-off level configured to turn off the reset module and the reset control module is configured for connecting the first receiving terminal with the output terminal thereof when the first control terminal receives the first level, and connecting the second receiving terminal with the output terminal thereof when the second control terminal receives the first level, the output terminal outputs a level consistent with that of the first receiving terminal when the output terminal is connected with both the first receiving terminal and the second receiving terminal, the method comprises: receiving a signal to be shifted by the first control terminal of the reset control module, receiving a shifted signal outputted by the shift register unit in the next stage through the second control terminal of the reset control module, when the first control terminal receives the first level, receiving the reset-off level by the first receiving terminal, and when the first control terminal receives the second level and the second control terminal receives the first level, receiving the reset-on level by the second receiving terminal.

29. The method of claim 26, wherein, when the shift register unit further comprises: a reset enhancing module and a reset enhancing control module, where an output terminal of the reset enhancing module is connected with the first node for resetting level of the first node, an output terminal of the reset enhancing control module is connected with a control terminal of the reset enhancing module for turning on the reset enhancing module to continue to reset the first node under the control of control signal received by a control terminal of the reset enhancing control module after the level of the first node is reset to be the output-off level by the reset module, the method further comprises:
after the reset module resets the first node to be at the output-off level configured to turn off the output module, applying a control signal on the control terminal of the reset enhancing control module to turn on the reset enhancing control module,
wherein
the output terminal of the input module is configured for setting the first node to be at an output-on level configured to turn on the output module when a received signal to be shifted is at a pulse level;
the output module is configured for outputting a shifted signal when the first node is at the output-on level; and the reset module is configured for resetting the first node to be at an output-off level configured to turn off the output module after the output module outputs the shifted signal.

30. The method of claim 26, wherein, the output terminal of the input module is configured for setting the first node to be at an output-on level configured to turn on the output module when a received signal to be shifted is at a pulse level;

the output module is configured for outputting a shifted signal when the first node is at the output-on level;

the reset module is configured for resetting the first node to be at an output-off level configured to turn off the output module after the output module outputs the shifted signal;

wherein the shift register unit further comprises:

a reset enhancing module and a reset enhancing control module, an output terminal of the reset enhancing module is connected with the first node for resetting level of the first node, and an output terminal of the reset enhancing control module is connected with a control terminal of the reset enhancing module for turning on the reset enhancing module to continue to reset the first node under the control of control signal received by a control terminal of the reset enhancing control module after the level of the first node is reset to be the output-off level by the reset module;

the reset enhancing control module comprises a first receiving terminal and a second receiving terminal, a first control terminal and a second control terminal, the second receiving terminal is used for receiving a reset-enhancing-on level configured to turn on the reset enhancing module, the first receiving terminal is used for receiving a reset-enhancing-off level configured to turn off the reset enhancing module;

the first control terminal of the reset enhancing control module is connected with the first node for connecting the first receiving terminal and the output terminal thereof when the first node is at the output-on level, and connecting the second receiving terminal and the output terminal thereof when the second control terminal receives a respective active level, the output terminal outputs a level consistent with that of the first receiving terminal when the output terminal is connected with both the first receiving terminal and the second receiving terminal; and when the reset enhancing control module of the shift register unit further comprises a third control terminal and a third receiving terminal, where the third receiving terminal is used for receiving the reset-enhancing-on level, the reset enhancing control module is configured for connecting the third receiving terminal with the output terminal when the third control terminal receives a respective active level, and the output terminal outputs a level consistent with that of the first receiving terminal when the output terminal is connected with both the first receiving terminal and the third receiving terminal, the method further comprises: connecting the second control terminal of the reset enhancing control module with a third clock signal input terminal, connecting the third control terminal with a fourth clock signal input terminal, so that the output terminal of the reset enhancing control module is alternatively connected with the first receiving terminal and the second receiving terminal of the reset enhancing control module.

31. The method of claim 26, wherein, the output terminal of the input module is configured for setting the first node to be at an output-on level configured to turn on the output module when a received signal to be shifted is at a pulse level;

the output module is configured for outputting a shifted signal when the first node is at the output-on level;

the reset module is configured for resetting the first node to be at an output-off level configured to turn off the output module after the output module outputs the shifted signal;

wherein the shift register unit further comprises:

a reset enhancing module and a reset enhancing control module, an output terminal of the reset enhancing module is connected with the first node for resetting level of the first node, and an output terminal of the reset enhancing control module is connected with a control terminal of the reset enhancing module for turning on the reset enhancing module to continue to reset the first node under the control of control signal received by a control terminal of the reset enhancing control module after the level of the first node is reset to be the output-off level by the reset module;

wherein the shift register unit further comprises a load output module, a control terminal of the load output module is connected with the first node for outputting the shifted signal when the first node is at the output-on level; and when the shift register unit further comprises a pinch-off module, which is turned on for pinching off the input module and/or the reset module and/or the reset enhancing module when the shifted signal outputted is at a pulse level, the method further comprises: when the shifted signal outputted by the shift register unit is at a pulse level, applying a control signal to turn on the pinch-off module.

\* \* \* \* \*